United States Patent [19]
Kim

[11] Patent Number: 5,926,420
[45] Date of Patent: Jul. 20, 1999

[54] MERGED MEMORY AND LOGIC (MML) INTEGRATED CIRCUITS INCLUDING DATA PATH WIDTH REDUCING CIRCUITS AND METHODS

[75] Inventor: Gyu-hong Kim, Seoul, Rep. of Korea

[73] Assignee: Samsung Electronics Co., Ltd., Suwon, Rep. of Korea

[21] Appl. No.: 09/001,865

[22] Filed: Dec. 31, 1997

Related U.S. Application Data

[30] Foreign Application Priority Data

Jul. 14, 1997 [KR] Rep. of Korea ................. 97-32669

[51] Int. Cl.$^6$ ................................................ G11C 7/00
[52] U.S. Cl. ................................ 365/189.02; 365/201
[58] Field of Search .................. 365/189.02, 230.02, 365/201; 371/21.1, 21.2

[56] References Cited

U.S. PATENT DOCUMENTS

| | | | |
|---|---|---|---|
| 5,293,386 | 3/1994 | Muhmenthaler et al. | 371/21.1 |
| 5,315,553 | 5/1994 | Moris | 365/201 |
| 5,377,144 | 12/1994 | Brown | 365/189.02 |
| 5,465,257 | 11/1995 | Yamahata et al. | 371/22.5 |
| 5,483,493 | 1/1996 | Shin | 365/201 |
| 5,535,165 | 7/1996 | Davis et al. | 365/201 |
| 5,574,692 | 11/1996 | Dierke | 365/201 |
| 5,642,479 | 6/1997 | Flynn | 395/183.21 |
| 5,677,877 | 10/1997 | Yoon et al. | 365/189.02 |
| 5,848,016 | 12/1998 | Kwak | 365/201 |

FOREIGN PATENT DOCUMENTS

| | | | |
|---|---|---|---|
| 0 636 976 A1 | 2/1995 | European Pat. Off. | G06F 11/00 |
| 0 840 217 A1 | 5/1998 | European Pat. Off. | G06F 11/00 |
| 2 305 732 | 4/1997 | United Kingdom | G01R 31/317 |

OTHER PUBLICATIONS

Search Report, GB 9802819.4, Jul. 8, 1998.

*Primary Examiner*—Son Mai
*Attorney, Agent, or Firm*—Myers Bigel Sibley & Sajovec

[57] ABSTRACT

Merged Memory and Logic (MML) integrated circuits include data path width reducing circuits and methods that are responsive to a test mode signal. In particular, MML circuits include a memory block, a logic block and a first plurality of output data paths that interconnect the memory block and the logic block. A data path width reducing circuit is responsive to a test mode signal, to serially provide output data on the first plurality of output data paths to at least one MML integrated circuit output pad, wherein the number of MML integrated circuit output pads is less than the first plurality. The external data path of the MML integrated circuit is thereby reduced during the test mode. The MML integrated circuit may also include a second plurality of input data paths that interconnect the memory block and the logic block. The data path width reducing circuit also serially provides input data from at least one MML integrated circuit input pad to the second plurality of input data paths wherein the number of MML integrated circuit input pads is less than the second plurality. Preferably, the first and second pluralities are identical and the number of MML integrated circuit input pads and output pads are identical.

29 Claims, 7 Drawing Sheets

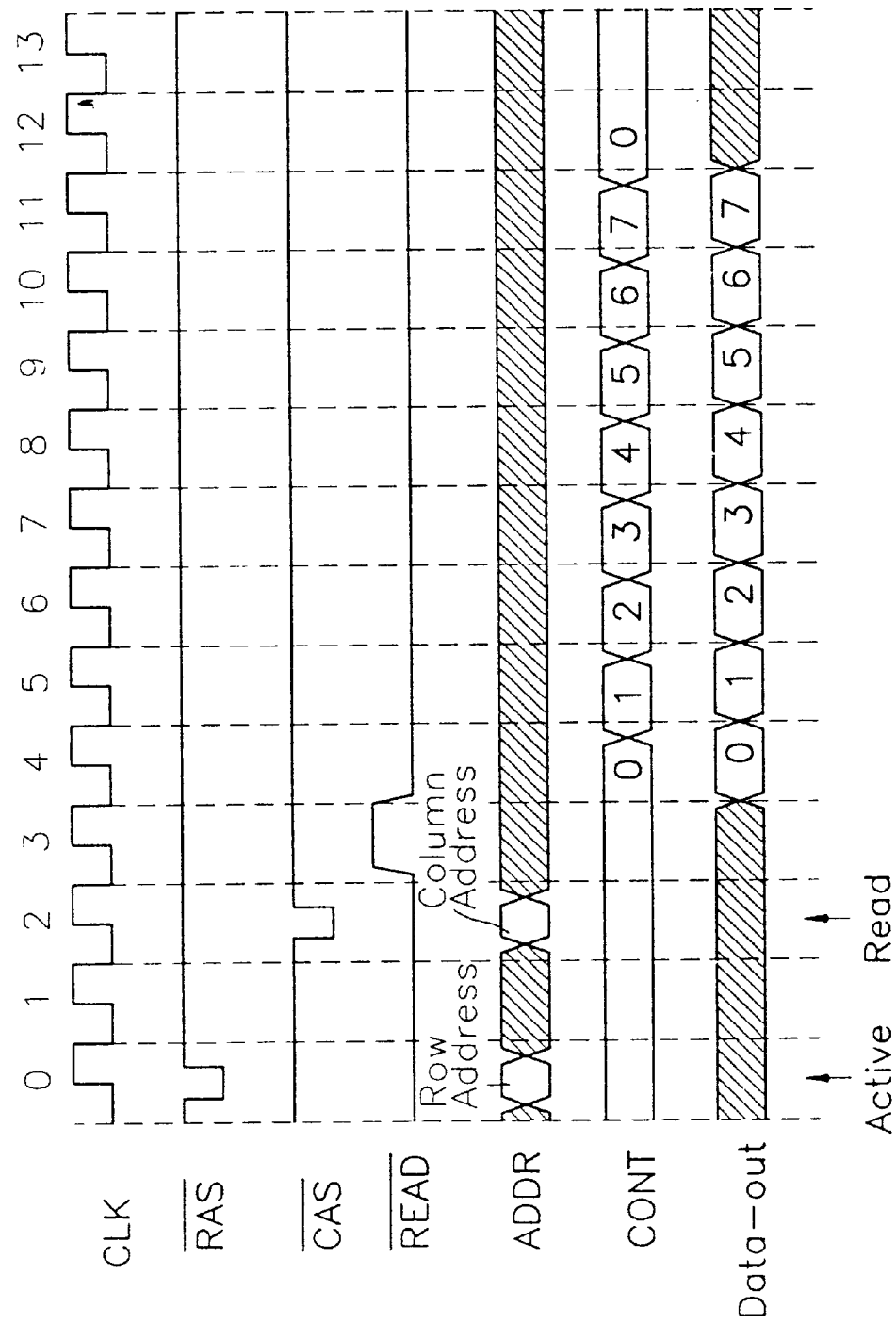

MERGED MEMORY AND LOGIC (MML) INTEGRATED CIRCUITS INCLUDING DATA PATH WIDTH REDUCING CIRCUITS AND METHODS

FIELD OF THE INVENTION

This invention relates to integrated circuit devices, and more particularly to testing of integrated circuit devices.

BACKGROUND OF THE INVENTION

Integrated circuit devices, such as integrated circuit memory devices and integrated circuit logic devices, are widely used in consumer and commercial applications. As the integration densities of these integrated circuits continue to increase, the number of internal data paths in the integrated circuit also generally continues to increase. The data path width also generally reflects the number of data input/output channels, referred to as "DQ" channels.

In simple integrated circuits, "x1" products having one-DQ were used. These were followed by "x4" and "x8" products having four and eight bit wide data paths, respectively. In the current state of the art, byte-wide "x16" products are also widely used. In the future, the number of DQ channels may be expected to increase further.

Recently, Merged Memory and Logic (MML) integrated circuits have been developed. MML integrated circuits generally include a large capacity memory and a large logic block that are merged in one integrated circuit. Thus, an MML integrated circuit can replace discrete memory and logic chips that are used in personal computers and other consumer and commercial devices.

In an MML integrated circuit, in order to provide effective communications between the large memory block and the large logic block, a large number of internal data paths may be provided. For example, 256 or more internal data paths may be provided.

The large number of data paths that are used in state-of-the-art integrated circuits may present a problem during testing of the integrated circuits. For example, in testing, multiple integrated circuits are often tested by test equipment simultaneously. The test equipment generally includes a fixed number of DQ channels and test pins, for reading data from and writing data into integrated circuit devices that are being tested. Thus, when the integrated circuit memory device has a large data path width, the number of integrated circuit devices that can be tested simultaneously may be reduced.

In order to increase the number of integrated circuit devices that can be tested simultaneously, a reduced DQ scheme can be used in which an integrated circuit device can be tested using a reduced data path width. For example, an x16 device can be tested in an x4 mode. Alternatively, a Merged DQ (MDQ) technique can be used in which several internal DQs are merged onto one input/output pad.

A conventional MDQ technique will now be described. In one important test of a memory device, a first logic value such as ZERO is written into all of the memory cells. All of the memory cells are then read to determine that all ZEROs were stored. Then, a second logic value such as ONE is written into all the memory cells and read from the memory cells to determine that ONE was stored. High density integrated circuit memory devices and MML devices often provide built-in testing circuits. Thus, comparators may be provided in the integrated circuit to compare data read from the memory cells in order to determine whether all ONEs or all ZEROs were properly written and read. Then, an indication may be provided on a single input/output pad as to whether all ZEROs were properly written and read and all ONEs were properly written and read. Thus, an MDQ technique is provided.

In order to provide this built-in test circuitry, multiple comparators are used to compare the data on the data paths in the integrated circuit. The multiple comparators can thus merge the data on multiple data paths into a single output, for the MDQ technique.

Unfortunately, as the number of internal data paths increase, the number of comparators may also increase prohibitively. For example, in an MML integrated circuit, which can include up to 256 or more internal data paths and up to 8 or more external data paths, up to 32 or more internal data paths may be merged into each output DQ pad. Thus, up to 32 or more internal DQs are compared with one another. This may use 31 one-bit comparators for each group of 32 internal DQs. Thus, up to 248 or more one-bit comparators may be used in the MML integrated circuit. The area and complexity of this MDQ circuit may therefore become prohibitively large.

SUMMARY OF THE INVENTION

It is therefore an object of the present invention to provide improved Merged Memory and Logic (MML) integrated circuits.

It is another object of the present invention to provide improved testing circuits and methods for MML integrated circuits.

It is still another object of the present invention to provide MML integrated circuit testing circuits and methods that can reduce or eliminate comparators in the testing circuits.

These and other objects are provided, according to the present invention, by MML integrated circuits that include data path width reducing circuits and methods that are responsive to a test mode signal. In particular, MML circuits according to the invention include a memory block, a logic block and a first plurality of output data paths that interconnect the memory block and the logic block. A data path width reducing circuit is responsive to a test mode signal, to serially provide output data on the first plurality of output data paths to at least one MML integrated circuit output pad, wherein the number of MML integrated circuit output pads is less than the first plurality. The external data path of the MML integrated circuit is thereby reduced during the test mode.

The MML integrated circuit may also include a second plurality of input data paths that interconnect the memory block and the logic block. The data path width reducing circuit also serially provides input data from at least one MML integrated circuit input pad to the second plurality of input data paths wherein the number of MML integrated circuit input pads is less than the second plurality. Preferably, the first and second pluralities are identical.

Various embodiments of data path width reducing circuits according to the present invention may be provided. In one embodiment, the data path width reducing circuit comprises at least one multiplexer that multiplexes the output data on the first plurality of data paths to the at least one data MML integrated circuit output pad. At least one demultiplexer may also be provided that demultiplexes the input data from the at least one MML integrated circuit pad to the second plurality of input data paths. In this embodiment, an address controller may also be included that provides output data path address signals to the at least one multiplexer to cause the at least one multiplexer to serially address selected ones of the first plurality of output data paths. The address controller may include a plurality of address pads that provide the output data path address signals to the at least one multiplexer.

In another embodiment, the address controller may also include a plurality of address pads and at least one register that is responsive to the plurality of address pads, to store signals that are received from the plurality of address pads and to produce the output data path address signals from the stored signals. In yet another embodiment, the address controller comprises at least one counter that provides the output data path address signals to the at least one multiplexer. The test mode signal preferably comprises a combination of an active row address strobe signal, a column address signal and a write enable signal.

MML testing methods according to the invention include the step of serially providing output data on a first plurality of data paths to at least one MML integrated circuit output pad, wherein the number of MML integrated circuit output pads is less than the first plurality, in response to a test mode signal, to thereby reduce an external data path width of the MML integrated circuit during test mode. Input data may also be serially provided from at least one MML integrated circuit input pad to a second plurality of input data paths, wherein the number of MML integrated circuit input pads is less than the second plurality. The serially providing step may include the steps of multiplexing data in response to address signals that may be stored in the MML integrated circuit, as was already described. Accordingly, improved testing of MML circuits that can reduce or eliminate comparators in the testing circuits may be provided.

BRIEF DESCRIPTION OF THE DRAWINGS

FIG. 7 is a timing diagram of various signals illustrating the operation of the MML integrated circuit of FIG. 6.

DETAILED DESCRIPTION OF PREFERRED EMBODIMENTS

Figure 1:
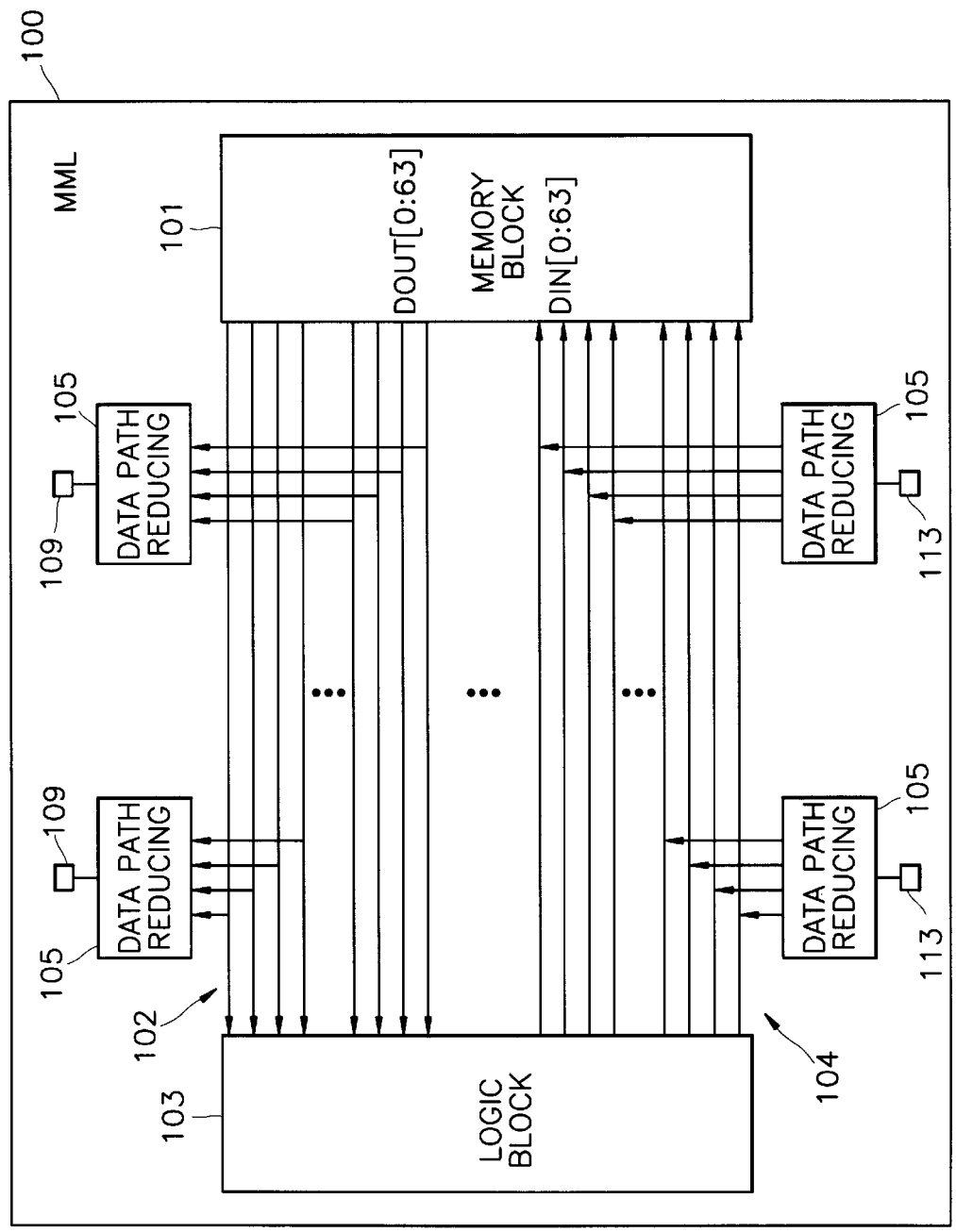
FIG. 1 is a schematic block diagram of MML integrated circuits including data path reducing according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a block diagram of MML integrated circuits according to the present invention is shown. As shown in FIG. 1, MML integrated circuit 100, also referred to as an MML includes a memory block 101 and a logic block 103. The memory block may be a Synchronous Dynamic Random Access Memory (SDRAM). As also shown in FIG. 1, a plurality of data paths interconnect the memory block and the logic block. More particularly, as shown in FIG. 1, a first plurality of output data paths 102 interconnect the memory block and logic block, and a second plurality of input data paths 104 also interconnect the logic block and the memory block. Preferably, the first and second pluralities are the same and are generally a large number, such as 64 or more. Separate input data and output data paths may be provided to improve the performance over a conventional general purpose SDRAM wherein these paths are bound together. The separation can enhance data transmission rates between the memory block 101 and the logic block 103.

During normal operation of the MML, the input data DIN[0:63] of the memory block 101 is input from the logic block 103, and the output data DOUT[0:63] of the memory block 101 is output to the logic block 103. However, when the memory block 101 is to be tested during a test mode, the memory block 101 generally must be able to be accessed directly from outside the chip. Since the input data and output data of the memory block 101 are 64 bits, respectively, 128 DQ pads may be needed for accessing the memory block 101 external to the MML. In this case, since the number of DQs is increased, the number of simultaneously testable integrated circuits may be reduced so that the testing time may increase.

In order to reduce the number of data paths during test mode, at least one data path width reducing circuit 105 is provided. The data path width reducing circuit is responsive to a test mode signal, to serially provide output data on the first plurality of data paths 102 to at least one MML integrated circuit output pad 109, wherein the number of MML integrated circuit output pads is less than the first plurality, to thereby reduce an external data path width of the MML integrated circuit during test mode. The data path width reducing circuit may also serially provide input data from at least one MML integrated circuit input pad 113 to the second plurality of input data paths 104, wherein the number of MML integrated circuit input pads is less than the second plurality.

As shown in FIG. 1, four input or output data paths are reduced to one input or output pad by data path reducing circuits 105. In embodiments that will be described below, eight input or output data paths are reduced to a single input or output pad. However, it will be understood by those having skill in the art that one or more data path reducing circuits may be provided in an MML integrated circuit chip wherein each data path width reducing circuit reduces at least two data paths in the MML integrated circuit.

Figure 2:
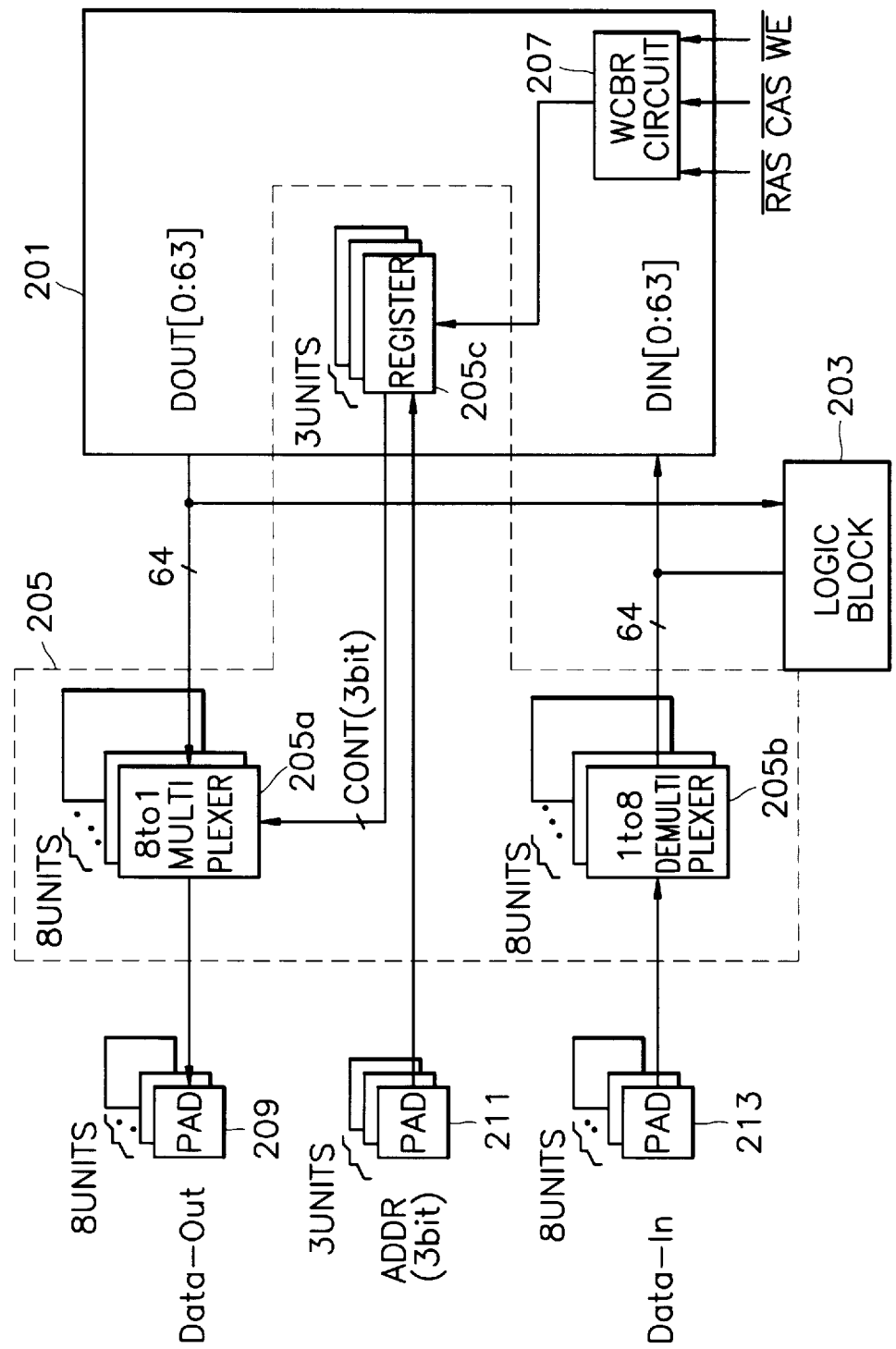
FIG. 2 is a schematic block diagram of an MML integrated circuit including a first embodiment of a data path reducing circuit according to the present invention.

FIG. 2 is a schematic block diagram of an MML integrated circuit having a data path width reducing circuit, also referred to as a "DQ number reducing circuit", according to a first embodiment of the present invention, illustrating the case of 64-bit input data DIN[0:63] and 64-bit output data DOUT[0:63].

Referring to FIG. 2, the MML includes a memory block 201 that can be an improved general purpose SDRAM, and a logic block 203, and further includes a DQ number reducing circuit 205 for reducing the number of DQs during a test mode.

The DQ number reducing circuit 205 includes eight 8:1 multiplexers 205a, eight 1:8 demultiplexers 205b, and three registers 205c. Each of the 8:1 multiplexers 205a receives 8 bits from the 64-bit output data DOUT[0:63], selects one of them in response to a 3-bit control signal CONT and outputs the same to the respective output pads 209. Each of the 1:8 demultiplexers 205b demultiplexes input data Data-In input through the respective input pads 213 and transfers the same to the memory block 201 so that the data is written in the respective eight memory cells. Each of the registers 205c stores a 3-bit address ADDR externally applied to each of three address pads 211 during a WCBR mode, and generates the 3-bit control signal CONT corresponding to the stored address. Therefore, the number of DQs of the MML is reduced to 16 (8 output DQs and 8 input DQs) during a test mode.

The WCBR mode is set in a WCBR circuit 207 when a row address strobe signal $\overline{RAS}$, a column address strobe signal $\overline{CAS}$, and a write enable signal $\overline{WE}$, input to the memory block 201, are all activated to logic "low." Three-bit address ADDR is used to control the 8:1 multiplexers 205a. The 3-bit address is preferably a normal address that is used during row and column access.

Figure 3:
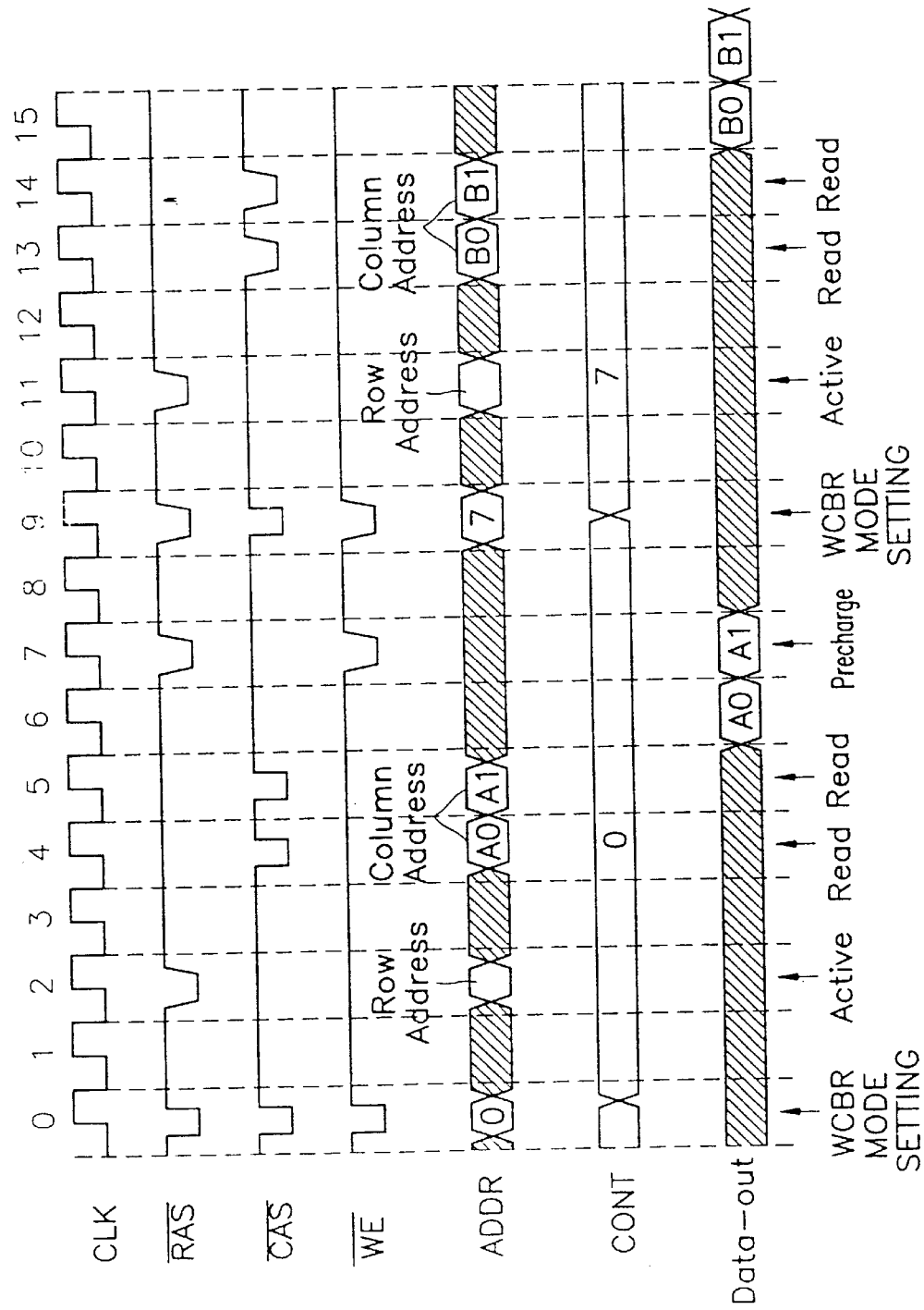
FIG. 3 is a timing diagram of various signals illustrating the operation of the MML integrated circuit of FIG. 2.

Referring to FIG. 3, the operation of the MML having a DQ number reducing circuit 205 according to a first embodiment of the present invention will be described in more detail. When the memory block 201 of the MML is to be tested, a WCBR mode is first set. If the row address strobe signal $\overline{RAS}$, the column address strobe signal $\overline{CAS}$, and the write enable signal $\overline{WE}$ are all activated to logic "low" at a cycle 0 of a clock CLK, the WCBR mode is set in the WCBR circuit 207. If the corresponding 3-bit address ADDR for controlling the multiplexers 205a is applied in a state where the WCBR mode is set, the respective bits of the address ADDR are stored in the three registers 205c. Accordingly, the registers 205c maintain the 3-bit address ADDR until the WCBR mode is again set (at a clock cycle 9) and output the same as the 3-bit control signal CONT. Then, after row and column addresses are applied and the 64-bit output data DOUT[0:63] is read from memory cells in the memory block 201 (at clock cycle 4 and 5), each of the eight multiplexers 205a receives 8 bits among the output data, selects one of them in response to the 3-bit control signal CONT, and outputs the same to the respective output pads (Data-Out) 209.

Figure 4:
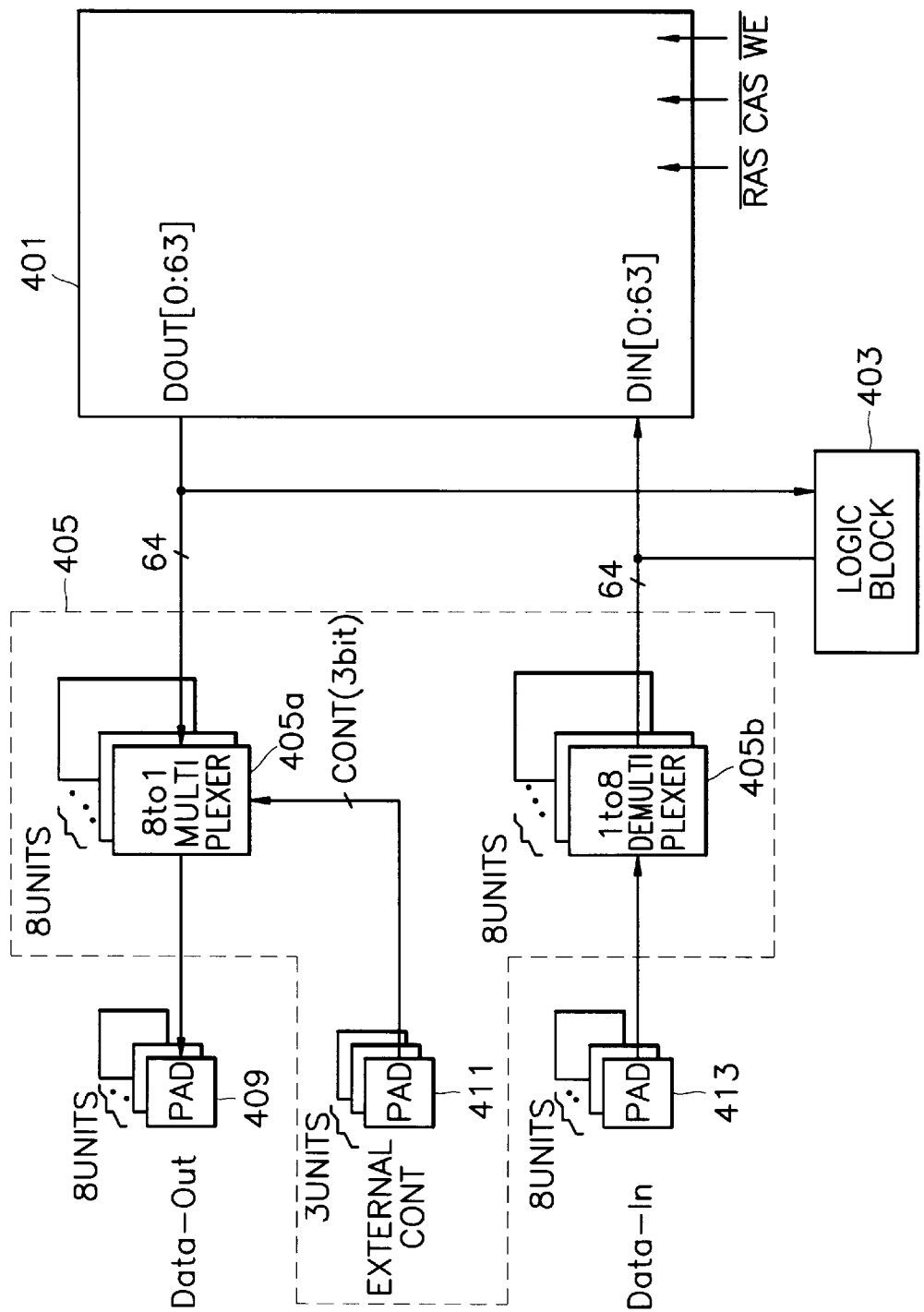
FIG. 4 is a schematic block diagram of an MML integrated circuit including a second embodiment of a data path reducing circuit according to the present invention.

FIG. 4 is a schematic block diagram of an MML having a DQ number reducing circuit according to a second embodiment of the present invention, illustrating the case of 64-bit input data DIN[0:63] and 64-bit output data DOUT[0:63]. Referring to FIG. 4, the MML includes a memory block 401 that can be an improved general purpose SDRAM, and a logic block 403, and further includes a DQ number reducing circuit 405 for reducing the number of DQs during a test mode.

The DQ number reducing circuit 405 includes eight 8:1 multiplexers 405a, eight 1:8 demultiplexers 405b, and three pads 411. Each of the 8:1 multiplexers 405a receives each 8 bits from the 64-bit output data DOUT[0:63], selects one of them in response to a 3-bit control signal CONT and outputs the same to the respective output pads 409. Each of the 1:8 demultiplexers 405b demultiplexes input data Data-In that is input through the respective input pads 413 and transfers the same to the memory block 401 so that the data is written in the respective eight memory cells. Each of the pads 411 receives 3-bit external control signal EXTERNAL CONT from external to the chip. Therefore, the number of DQs of the MML is reduced to 16 (8 output DQs and 8 input DQs) during a test mode.

Figure 5:
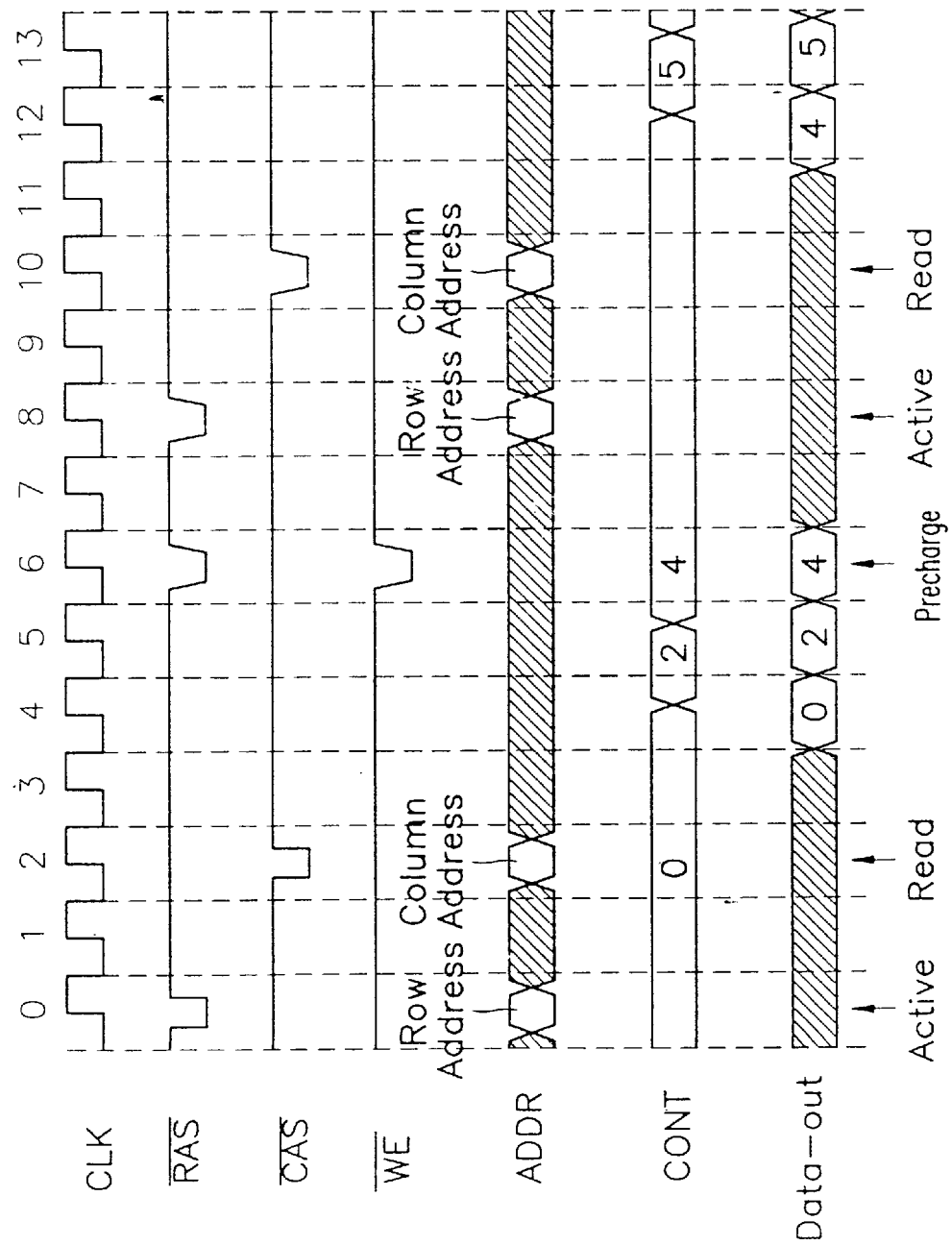
FIG. 5 is a timing diagram of various signals illustrating the operation of the MML integrated circuit of FIG. 4.

Referring to FIG. 5, operation of an MML having the DQ number reducing circuit 405 according to a second embodiment of the present invention will be described in more detail. When the memory block 401 of the MML is to be tested, a read command is first applied. That is to say, a row address strobe signal $\overline{RAS}$ is activated to a logic "low" and a row address is applied (at a clock cycle 0), and then a column address strobe signal $\overline{CAS}$ is activated to a logic "low" and a column address is applied. Then, 64-bit output data DOUT[0:63] are read from memory cells in the memory block 401 (at a clock cycle 2). Thereafter, a value of the 3-bit control signal CONT applied from the pads 411 with an appropriate delay interval is changed. Accordingly, each of the multiplexers 405a receives each 8-bit output data among the 64-bit output data DOUT[0:63] read from the memory block 401, selects one of them in response to 3-bit control signal CONT, and outputs the same to the respective output pads (Data-Out) 409.

Figure 6:
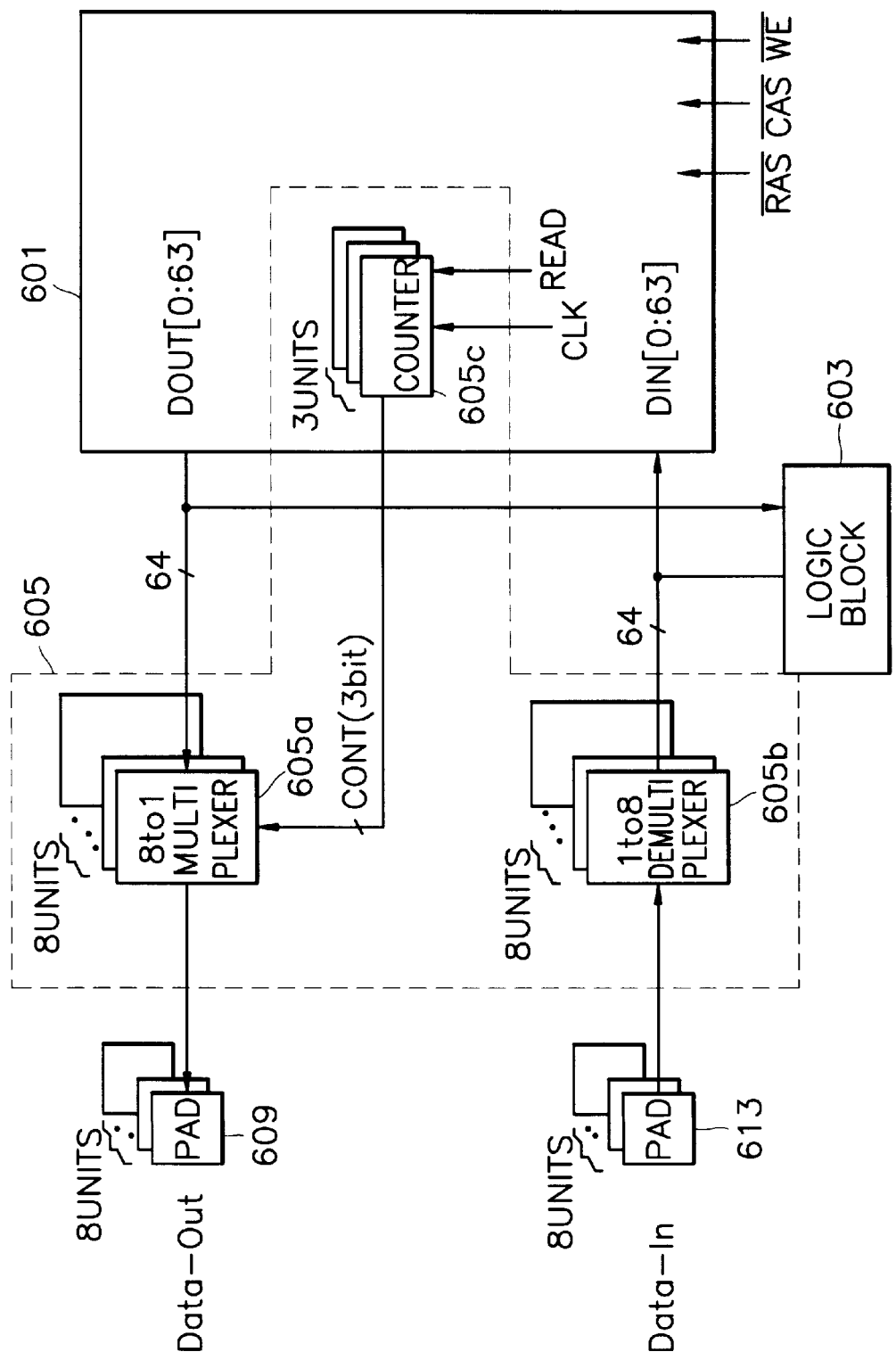
FIG. 6 is a schematic block diagram of an MML integrated circuit including a third embodiment of a data path reducing circuit according to the present invention.

FIG. 6 is a schematic block diagram of an MML having a DQ number reducing circuit according to a third embodiment of the present invention, illustrating the case of 64-bit input data DIN[0:63] and 64-bit output data DOUT[0:63]. Referring to FIG. 6, the MML includes a memory block 601 that can be an improved general purpose SDRAM, and a logic block 603, and further includes a DQ number reducing circuit 605 for reducing the number of DQs during a test mode.

The DQ number reducing circuit 605 includes eight 8:1 multiplexers 605a, eight 1:8 demultiplexers 605b and three counters 605c. Each of the 8:1 multiplexers 605a receives 8 bits from the 64-bit output data DOUT[0:63], selects one of them in response to a 3-bit control signal CONT and outputs the same to the respective output pads 609. Each of the 1:8 demultiplexers 605b demultiplexes input data Data-In input through the respective input pads 613 and transfers the same to the memory block 601 so that the data is written in the respective eight memory cells. Each of the counters 605c, synchronized with an external clock CLK in a state where a read signal READ is activated, generates the 3-bit control signal CONT. Therefore, the number of DQs of the MML is reduced to 16 (8 output DQs and 8 input DQs) during a test mode.

Referring to FIG. 7, operation of an MML having the DQ number reducing circuit 605 according to the third embodiment of the present invention will be described in more detail. When the memory block 601 of the MML is to be tested, a read command is first applied and the read signal READ is activated (at a clock cycle 3). Thus, the counters 605c generate the sequentially increasing 3-bit control signal CONT. Accordingly, each of the multiplexers 605a receives 8 bits among the 64-bit output data DOUT[0:63] read from the memory block 601, selects one of them in response to the 3-bit control signal CONT, and outputs the same to the respective output pads (Data-Out) 609. In more detail, the 3-bit control signal CONT becomes (0, 0, 0) in a state where the counters 605c are reset initially, and a read command is applied so that 64-bit the output data DOUT[0:63] is read from the memory block 601. Then, from the next clock cycle 4, the 3-bit control signal CONT sequentially increases, to finally become (1, 1, 1).

Accordingly, each of the multiplexers 605a receives 8 bits from the 64-bit output data DOUT[0:63] read from the memory block 601, sequentially selects one of them in response to the 3-bit control signal CONT and outputs the same to the respective output pads 609.

As described above, in the MML having DQ number reducing circuits according the present invention, during a normal operation mode, write and read operations of a memory block are performed by 64 bits, i. e., x64. During a read operation of a test mode, since the number of DQs externally connected is 8, each of eight 8:1 multiplexers receives 8 bits from the 64-bit output data DOUT[0:63] read from a memory block, selects one of them in response to a 3-bit control signal CONT, and outputs the same to the respective pads. Also, during a write operation of a test mode, data input through 8 DQ pads are stored to 64-bit input data. The data input through the respective pads pass through the respective 1:8 demultiplexers so that the data is written in 8 bits.

Therefore, the DQ number reducing circuits and methods according to the present invention do not require comparators and can have simple structure. Accordingly, MML integrated circuits having the DQ number reducing circuits or methods can greatly reduce the number of DQs, thereby increasing the number of simultaneously testable MML integrated circuits.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A merged memory and logic (MML) integrated circuit comprising:
   a memory block;
   a logic block;
   a first plurality of output data paths that interconnect the memory block and the logic block for communication therebetween in a normal mode; and
   a data path width reducing circuit that is separate from the logic block and that is responsive to a test mode signal, to serially provide output data on the first plurality of data paths to at least one MML integrated circuit output pad, wherein the number of MML integrated circuit output pads is less than the first plurality, to thereby reduce an external data path width of the MML integrated circuit during test mode.

2. An MML integrated circuit according to claim 1 further comprising a second plurality of input data paths that interconnect the memory block and the logic block;
   wherein the data path width reducing circuit further serially provides input data from at least one MML integrated circuit input pad to the second plurality of input data paths, wherein the number of MML integrated circuit input pads is less than the second plurality.

3. An MML integrated circuit according to claim 2 wherein the first and second pluralities are identical.

4. An MML integrated circuit according to claim 1 wherein the data path width reducing circuit comprises at least one multiplexer that multiplexes the output data on the first plurality of data paths to the at least one MML integrated circuit output pad.

5. An MML integrated circuit according to claim 2 wherein the data path width reducing circuit comprises at least one multiplexer that multiplexes the output data on the first plurality of data paths to the at least one MML integrated circuit output pad, and at least one demultiplexer that demultiplexes the input data from the at least one MML integrated circuit input pad to the second plurality of input data paths.

6. An MML integrated circuit according to claim 4 wherein the data path width reducing circuit further comprises an address controller that provides output data path address signals to the at least one multiplexer, to cause the at least one multiplexer to serially address selected ones of the first plurality of data paths.

7. An MML integrated circuit according to claim 6 wherein the address controller comprises a plurality of address pads that provide the output data path address signals to the at least one multiplexer.

8. An MML integrated circuit according to claim 6 wherein the address controller comprises a plurality of address pads and at least one register that is responsive to the plurality of address pads, to store signals that are received from the plurality of address pads and to produce the output data path address signals from the stored signals.

9. An MML integrated circuit according to claim 6 wherein the address controller comprises at least one counter that provides the output data path address signals to the at least one multiplexer.

10. An MML integrated circuit according to claim 1 wherein the test mode signal comprises a combination of a row address strobe signal, a column address strobe signal and a write enable signal.

11. A merged memory and logic (MML) integrated circuit comprising:
    memory means;
    logic means;
    a first plurality of output data paths that interconnect the memory means and the logic means for communication therebetween in a normal mode; and
    means for serially providing output data on the first plurality of data paths to at least one MML integrated circuit output pad, wherein the number of MML integrated circuit output pads is less than the first plurality, in response to a test mode signal, to thereby reduce an external data path width of the MML integrated circuit during test mode, the serially providing means being separate from the logic means.

12. An MML integrated circuit according to claim 11 further comprising a second plurality of input data paths that interconnect the memory means and the logic means;
    wherein the serially providing means further comprises means for serially providing input data from at least one MML integrated circuit input pad to the second plurality of input data paths, wherein the number of MML integrated circuit input pads is less than the second plurality.

13. An MML integrated circuit according to claim 12 wherein the first and second pluralities are identical.

14. An MML integrated circuit according to claim 11 wherein the serially providing means comprises means for multiplexing the output data on the first plurality of data paths to the at least one MML integrated circuit output pad.

15. An MML integrated circuit according to claim 12 wherein the serially providing means comprises means for multiplexing the output data on the first plurality of data paths to the at least one MML integrated circuit output pad, and means for demultiplexing the input data from the at least one MML integrated circuit input pad to the second plurality of input data paths.

16. An MML integrated circuit according to claim 14 wherein the serially providing means further comprises means for providing output data path address signals to the multiplexing means, to cause the multiplexing means to serially address selected ones of the first plurality of data paths.

17. An MML integrated circuit according to claim 16 wherein the means for providing output data path address signals comprises a plurality of address pads that provide the output data path address signals to the multiplexing means.

18. An MML integrated circuit according to claim 16 wherein the means for providing output data path address signals comprises a plurality of address pads and means for storing signals that are received from the plurality of address pads and for producing the output data path address signals from the stored signals.

19. An MML integrated circuit according to claim 16 wherein the means for providing output data path address signals comprises counting means for generating the output data path address signals.

20. An MML integrated circuit according to claim 11 wherein the test mode signal comprises a combination of a row address strobe signal, column address strobe signal and write enable signal.

21. A method of testing a merged memory and logic (MML) integrated circuit including a memory block, a logic block and a first plurality of output data paths that interconnect the memory block and the logic block for communication therebetween in a normal mode, the testing method comprising the following step that is performed in the MML integrated circuit:

serially providing output data on the first plurality of data paths to at least one MML integrated circuit output pad using a data path width reducing circuit that is separate from the logic block, wherein the number of MML integrated circuit output pads is less than the first plurality, in response to a test mode signal, to thereby reduce an external data path width of the MML integrated circuit during test mode.

22. A method according to claim 21 wherein the MML integrated circuit further comprises a second plurality of input data paths that interconnect the memory block and the logic block, the serially providing step further comprising the step of:

serially providing input data from at least one MML integrated circuit input pad to the second plurality of input data paths, wherein the number of MML integrated circuit input pads is less than the second plurality.

23. A method according to claim 22 wherein the first and second pluralities are identical.

24. A method according to claim 21 wherein the serially providing step comprises the step of multiplexing the output data on the first plurality of data paths to the at least one MML integrated circuit output pad.

25. A method according to claim 22 wherein the serially providing step comprises the steps of:

multiplexing the output data on the first plurality of data paths to the at least one MML integrated circuit output pad; and demultiplexing the input data from the at least one MML integrated circuit input pad to the second plurality of input data paths.

26. A method according to claim 24 wherein the multiplexing step is preceded by the step of providing output data path address signals, and wherein the multiplexing step is performed in response to the output data path address signals.

27. A method according to claim 26 wherein the following steps are performed between the steps of providing output data path address signals and the multiplexing step:

storing signals that are received from a plurality of address pads; and producing the output data path address signals from the stored signals.

28. A method according to claim 26 wherein the step of providing output data path address signals comprises the step of sequentially counting to generate the output data path address signals.

29. A method according to claim 21 wherein the test mode signal comprises a combination of a row address strobe signal, column address strobe signal and write enable signal.

* * * * *